(12) United States Patent
Shin et al.

(10) Patent No.: US 6,501,184 B1
(45) Date of Patent: Dec. 31, 2002

(54) SEMICONDUCTOR PACKAGE AND METHOD FOR MANUFACTURING THE SAME

(75) Inventors: WonSun Shin, KyungKi-Do (KR); DoSung Chun, Chacheongsao (TH); SeonGoo Lee, KyungKi-Do; SangHo Lee, Seoul, both of (KR); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/574,006

(22) Filed: May 19, 2000

(30) Foreign Application Priority Data

May 20, 1999 (KR) .......................................... 99-018245
Sep. 7, 1999 (KR) .......................................... 99-037925
Sep. 7, 1999 (KR) .......................................... 99-037928

(51) Int. Cl.[7] .............................................. H01L 23/48
(52) U.S. Cl. ....................................... 257/778; 257/796
(58) Field of Search ........................ 361/704; 438/112; 257/710, 694, 778, 680, 787, 796, 706

(56) References Cited

U.S. PATENT DOCUMENTS

| 4,530,152 | A | | 7/1985 | Roche et al. | 29/588 |
|---|---|---|---|---|---|
| 4,707,724 | A | | 11/1987 | Suzuki et al. | 387/71 |
| 4,756,080 | A | | 7/1988 | Thorp Jr. et al. | 29/827 |
| 5,157,480 | A | | 10/1992 | McShane, et al. | 387/74 |
| 5,200,362 | A | | 4/1993 | Lin et al. | 437/207 |
| 5,273,938 | A | | 12/1993 | Lin et al. | 437/207 |
| 5,450,283 | A | * | 9/1995 | Lin et al. | 361/704 |
| 5,474,957 | A | | 12/1995 | Urushima | 437/209 |
| 5,474,958 | A | * | 12/1995 | Djennas et al. | 438/112 |
| 5,583,378 | A | * | 12/1996 | Marrs et al. | 257/710 |
| 5,604,376 | A | | 2/1997 | Hamburgen et al. | 257/676 |
| 5,620,928 | A | | 4/1997 | Lee et al. | 438/118 |
| 5,646,828 | A | | 7/1997 | Degani et al. | 361/715 |
| 5,652,185 | A | | 7/1997 | Lee | 437/219 |
| 5,696,666 | A | | 12/1997 | Miles et al. | 361/764 |
| 5,835,355 | A | | 11/1998 | Dordi | 361/760 |
| 5,859,471 | A | | 1/1999 | Kuraishi et al. | 257/666 |
| 5,866,949 | A | | 2/1999 | Schueller | 257/778 |
| 5,894,108 | A | * | 4/1999 | Mostafazadeh et al. | 257/694 |
| 5,903,052 | A | | 5/1999 | Chen et al. | 257/706 |
| 6,013,948 | A | | 1/2000 | Akram et al. | 257/698 |
| 6,034,423 | A | | 3/2000 | Mostafazadeh et al. | 257/691 |
| 6,034,427 | A | | 3/2000 | Lan et al. | 257/698 |
| 6,060,778 | A | * | 5/2000 | Jeong et al. | 257/710 |
| 6,099,677 | A | | 8/2000 | Logothetis et al. | 156/253 |
| 6,100,804 | A | | 8/2000 | Brady et al. | 340/572.7 |
| 6,107,689 | A | | 8/2000 | Kozono | 257/778 |
| 6,127,833 | A | | 10/2000 | Wu et al. | 324/755 |
| 6,172,419 | B1 | | 1/2001 | Kinsman | 257/737 |
| 6,268,568 | B1 | * | 7/2001 | Kim | 257/778 |

\* cited by examiner

Primary Examiner—David Nelms
Assistant Examiner—Bau T Le
(74) Attorney, Agent, or Firm—Skjerven Morrill LLP

(57) ABSTRACT

A semiconductor package and method for manufacturing the same is disclosed. The semiconductor package comprises a semiconductor chip, a circuit board, an electrical connection means, an encapsulation material and a plurality of conductive balls. The semiconductor chip has a first surface and a second surface. A plurality of input and output pads are formed on one of the first and second surfaces. The circuit board comprises a thin film having a first surface and a second surface and being provided with a center hole in which the semiconductor chip is positioned, a plurality of circuit patterns being formed on the first surface of the thin film and including a plurality of bond fingers and ball lands, and a cover coat covering the circuit board except for the bond fingers and the ball lands. The electric connection means electrically connects the input and output pads of the semiconductor chip with the bond fingers of the circuit board. The encapsulation material covers the semiconductor, the electric connection means and a portion of the circuit board. The conductive balls are fusion-welded on the ball lands of the circuit board.

22 Claims, 17 Drawing Sheets

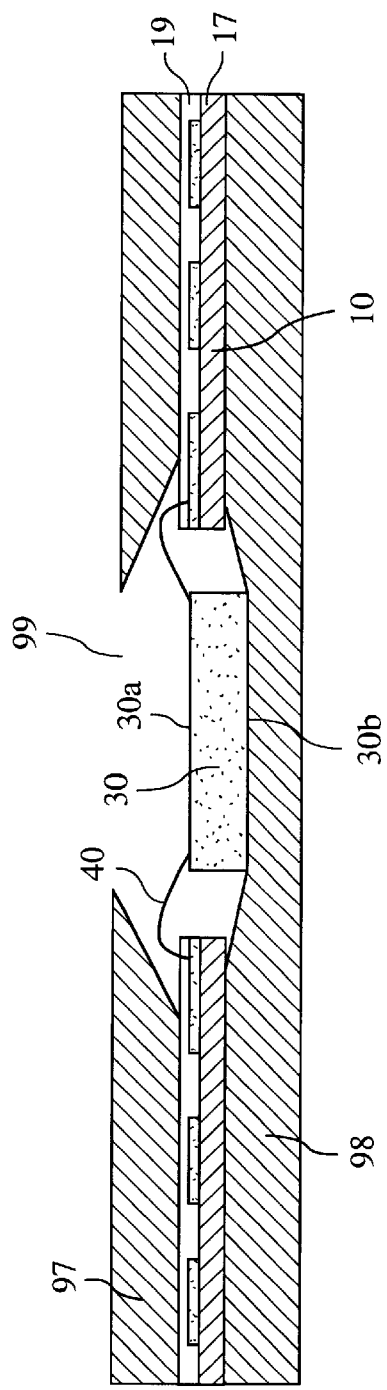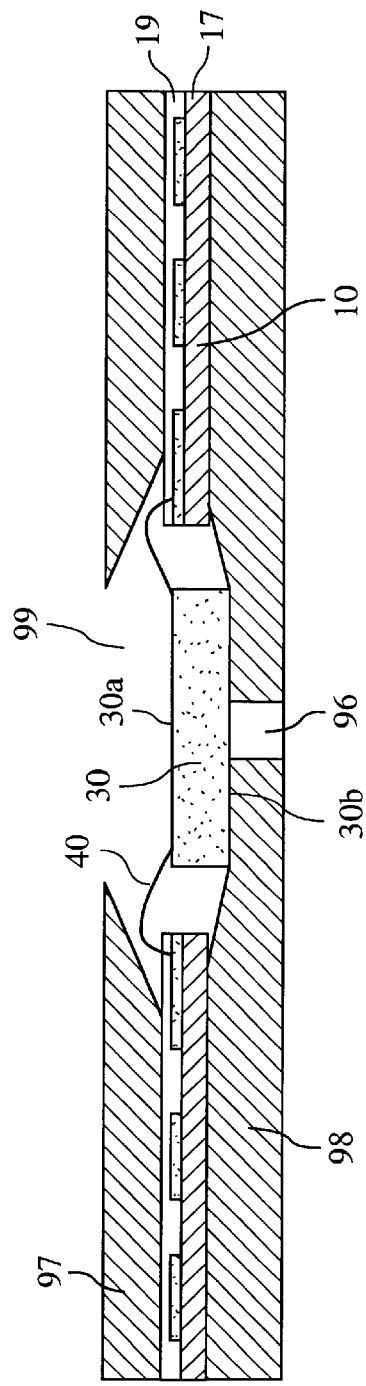
FIG. 16A
FIG. 16B

SEMICONDUCTOR PACKAGE AND METHOD FOR MANUFACTURING THE SAME

BACKGROUND OF THE INVENTION

1. Field of the Invention

The present invention relates, in general, to a semiconductor and method for manufacturing the same and, more particularly, to a semiconductor that is thin and has a satisfactory heat dissipation capacity and method for manufacturing the same.

2. Description of the Prior Art

Currently, semiconductor packages, such as Ball Grid Array ("BGA") semiconductor packages Chip Scale semiconductor packages, and micro ball grid array semiconductor packages, are being miniaturized.

In addition, semiconductor chips in such packages are increasing in performance, function, and operation frequency. Consequently, the semiconductor chips generate more heat.

Of such semiconductor packages, a conventional BGA semiconductor package is illustrated in FIG. 14.

The BGA semiconductor package generally comprises a semiconductor chip 1', on which input and output pads are formed, and a circuit board 10' onto which the semiconductor chip 1' is bonded at the center of the circuit board 10' by means of a bonding agent 3'.

The circuit board 10' comprises a film 15', upper circuit patterns 12a' and lower circuit patterns 12b'. The upper circuit patterns 12a' include bond fingers 11' and are formed on the outer area of the upper surface of the film 15'. The lower circuit patterns 12b' include a plurality of ball lands 13' and are formed on the lower surface of the film 15'. The bond fingers 11' and ball lands 13' are conductive thin films made of copper (Cu) or the like. The upper and lower circuit patterns are connected to each other by conductive via holes 14'. The upper and lower surfaces of the circuit board 10', except for the bond fingers 11' and the ball lands 13', are coated with a cover coat 16' so as to protect the circuit patterns from the external environment'.

The input and output pads 2' of the semiconductor chip 1' are connected with the bond fingers 11' formed on the upper surface of the circuit board 10' through a conductive wire 4'. The upper surface of the circuit board 10', the chip 1' and the conductive wire 4' are covered with an encapsulating material 20' so as to protect the chip 1' and the conductive wires 4'.

A plurality of conductive balls 40' are fusion-welded on the ball lands 13'. The semiconductor package 100' is mounted to a motherboard (not shown), with the conductive balls 40' being fusion welded on metallizations of the motherboard, so that electric signals may be mediated between the semiconductor chip 1' and the motherboard by the conductive balls 40'.

In the BGA semiconductor package having the construction described above, the semiconductor chip 1' exchanges electric signals with the motherboard through the input and output pads 2', the conductive wire 4', the bond fingers 11', the via holes 14', the ball lands 13' and the conductive balls 40'.

However, according to the conventional semiconductor package, a semiconductor chip 1' is bonded on the upper surface of a relatively thick circuit board 10', thereby increasing a total thickness of the entire semiconductor package. This contrasts with the current trend toward miniaturization of packages, and so the package may not be fit for use in the latest mobile phones, cellular phones, radio pagers, and notebook computers.

In addition, the conventional semiconductor package does not provide means for dissipating heat. Such heat may lead to performance reduction and/or breakdown of the semiconductor package or a device employing the semiconductor package. Although another semiconductor package employing a heat spreader has been disclosed, this semiconductor package generates other problems, in that the thickness of this package is increased due to the addition of the heat spreader. Moreover, the manufacturing cost of such a package is expensive.

SUMMARY OF THE INVENTION

Accordingly, the present invention has been made keeping in mind the above problems occurring in the prior art, and an object of the present invention is to provide a semiconductor package and method for manufacturing the same, capable of reducing the thickness of the semiconductor package considerably.

Another object of the present invention is to provide a semiconductor package and method for manufacturing the same, capable of dissipating heat to the outside environment easily and effectively.

A further object of the present invention is to provide a semiconductor and method for manufacturing the same, capable of preventing a circuit board on which circuit patterns are formed, from being bent.

In order to accomplish the above objects and others, one embodiment of the present invention provides a semiconductor package that includes semiconductor chip having a first surface and a second surface, wherein a plurality of input and output pads are formed on one of the first and second surfaces; a circuit board comprising a thin film having a first surface, an opposite second surface, and a center hole in which the semiconductor chip is positioned; a plurality of circuit patterns on the first surface of the thin film, including a plurality of bond fingers and ball lands; a cover coat covering the circuit board except for the bond fingers and the ball lands; electrical conductors that electrically connect the input and output pads of the semiconductor chip with the bond fingers of the circuit board; an encapsulation material covering the semiconductor, the electrical conductors, and a portion of the circuit board; and, a plurality of conductive balls that are fusion-welded onto the ball lands of the circuit board.

The package may further comprise a heat spreader bonded on the second surface of the film.

The second surface of the semiconductor chip, one surface of the heat spreader and one surface of the encapsulation material may lie on the same plane.

The second surface of the semiconductor chip, the second surface of the film and one surface of the encapsulation material may lie on the same plane.

The second surface of the semiconductor chip and one surface of the encapsulation material may lie on the same plane.

The second surface of the film may be entirely covered with the film.

The second surface of the film may be partially covered with the film.

The input and output pads may be formed on the first surface of the semiconductor chip.

The input and output pads may be formed on the second surface of the semiconductor chip.

The first surface of the semiconductor chip and one surface of the encapsulation material may lie on the same plane.

In addition, the present invention provides a method of manufacturing a semiconductor package. One embodiment of such a method includes providing a circuit board, the circuit board having a film, circuit patterns and a plurality of holes, the film having a first surface and a second surface, the circuit patterns including a plurality of bond fingers and ball lands formed on one of the first and second surfaces; respectively positioning a plurality of semiconductor chips in the holes of the circuit board, each of the semiconductor chips having a first surface and a second surface, a plurality of input and output pads being formed on one of the first and second surfaces of semiconductor chips; electrically connecting the input and output pads of each semiconductor chip with the bond fingers of the respective circuit board; covering the semiconductor chips, connection means and a certain area of the circuit board with an encapsulation material; and forming input and output pads by respectively fusion-welding conductive balls on ball lands of the circuit board.

The circuit board may comprise a film, a plurality of circuit patterns and a cover coat, the film having a first surface and a second surface. The circuit board may be in the form of a main strip that consists of a plurality of sub-strips in a row with one or more multiple main slots being interposed between two adjacent sub-strips, each of the sub-strips having a plurality of regularly spaced holes in multiple rows, with each of the holes being surrounded by multiple sub-slots, the circuit patterns including a plurality of bond fingers and ball lands that are formed on the second surface of the film between the holes and the sub-slots, and the cover coat being coated on a surface of the film with the bond fingers and the ball lands of the circuit patterns being exposed to the outside.

The circuit board may comprise a film, a plurality of circuit patterns and a cover coat, the film having a first surface and a second surface and being in the form of a strip that has a plurality of regularly spaced holes in multiple rows with each of the holes being surrounded by multiple slots, the circuit patterns including a plurality of bond fingers and ball lands that are formed on the second surface of the film between the holes and the slots, and the cover coat being coated on a surface of the film with the bond fingers and the ball lands of the circuit patterns being exposed to the outside.

The method may further comprise the step of bonding a hole closing member on the second surface of the circuit board before the step of positioning the semiconductor chips in the holes of the circuit board.

The method may further comprise the step of bonding a hole closing member on the entire second surface of the main strip before the step of positioning the semiconductor chips in the holes of the circuit board.

The method may further comprise the step of bonding a hole closing member on the entire second surface of the strip before the step of positioning the semiconductor chips in the holes of the circuit board.

The hole closing member may consist of a plurality of hole closing member pieces, the hole closing member pieces being respectively bonded on the sub-strips, one side portion of each of the hole closing member pieces being positioned over each of the main slots.

The hole closing member may be provided with a plurality of hole lines at positions that are situated over the main slots.

The method may further comprise the step of separating one side portion of the hole closing member by rendering a plate-shaped bar to pass through the main slot in a direction from the second surface of the circuit board to the first surface of the circuit board, before or after the step of forming input and output pads by respectively fusion-welding conductive balls on ball lands of the circuit board.

The method may further comprise the step of removing the hole closing member, after the step of forming input and output pads by respectively fusion-welding conductive balls on ball lands of the circuit board.

The hole closing member may be an insulating or ultra-violet tape.

The step of encapsulating may be performed by means of a molding die in which the semiconductor chip can be positioned, the molding die being provided with a gate at a position that a portion of the semiconductor chip, on which input and output pads are formed, faces.

BRIEF DESCRIPTION OF THE DRAWINGS

The above and other objects, features and other advantages of the present invention will be more clearly understood from the following detailed description taken in conjunction with companying drawings, in which:

FIG. 16A is a cross-sectional side view of an alternative embodiment of a step of encapsulating; and FIG. 16B is a cross-sectional side view of a further alternative embodiment of a step of encapsulating.

DESCRIPTION OF THE EXEMPLARY EMBODIMENTS

FIGS. 1 to 9 are cross-sectional side views of various embodiments of semiconductor packages in accordance with the present invention.

Figure 1:
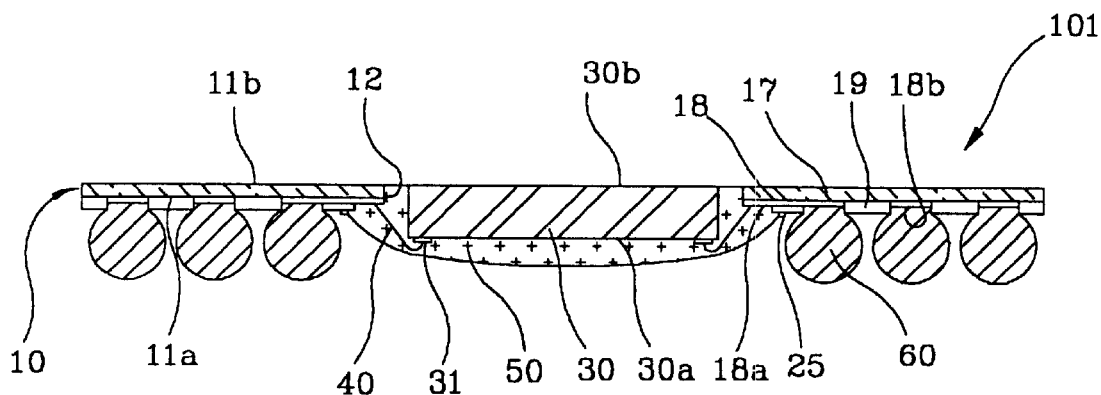
FIGS. 1 to 9 are cross-sectional side views showing embodiments/of semiconductor packages in accordance with the present invention.

Referring to FIG. 1, the semiconductor package 101 includes a semiconductor chip 30 that has a first surface 30*a* and an opposite second surface 30*b*. A plurality of input and output pads 31 are formed on the first surface 30*a*.

The semiconductor chip 30 is positioned in a center hole 12 formed through a circuit board 10. The area of the center hole 12 is larger than both the area of the first surface 30a and the area of the second surface 30b.

The circuit board 10 includes a thin planar insulative film 17 and a plurality of conductive circuit patterns 18. The thin film 17 has a first surface 11a and an opposite second surface 11b and is provided with the center hole 12 therethrough. Conductive circuit patterns 18 are formed on the first surface 11a of the thin film 17, and include bond fingers 18a and ball lands 18b. The circuit patterns 18 are, for example, thin copper films. Other metals may be used. Bond fingers 18a are laterally between center hole 12 and ball lands 18b. In addition, the film 17 constituting the circuit board 10 may be made of polyimide or another thin film. Alternatively, circuit board 10 may be an insulative tape.

Incidentally, the bond fingers 18a may be plated with gold (Au) or silver (Ag) so as to be effectively connected to an electric conductor 40, while the ball lands 18b are plated with gold (Au), silver (Au), nickel (Ni) or palladium (Pd) so as to be effectively welded to conductive balls 60.

The exposed surfaces of the film 17 and the circuit patterns 18 are covered with a cover coat 19 so as to be protected from external physical, chemical or mechanical impact. Bond fingers 18a and ball lands 18b are exposed through cover coat 19.

The input and output pads 31 of semiconductor chip 30 are electrically connected to the bond fingers 18a of the circuit patterns 18 by electric conductors 40. Electric conductors 40 extend laterally over the portion of center hole 12 between semiconductor chip 30 and bond fingers 18a on first surface 11a of circuit board 10. Here, the electric conductors 40 may be gold wires, aluminum wires, or leads.

The semiconductor chip 30 of and the electric conductor 40 are covered with an insulative encapsulation material 50 so as to be protected from external physical, chemical or mechanical impact. The encapsulation material may be epoxy molding compound that is applied using a mold or a liquid encapsulation material that is applied within a dam 25 using a dispenser. Dam 25 may be metal or an adhesive bead, among other possibilities. The second surface 30b of the semiconductor chip 30, the upper surface of the encapsulation material 50 in center hole 12 around chip 30, and the second surface 11b of the film 17 of the circuit board 10 lie in the same horizontal plane.

A plurality of conductive balls 60 made of tin (Sn), lead (Pb) or an alloy of tin and lead are respectively fusion-welded on the ball lands 18b of the circuit patterns 10 of the circuit board 10, thereby allowing the package to be mounted to a motherboard. Balls 60 are on the same side of package 101 as first surface 30a and input ouput pads 31 of chip 30.

The semiconductor 30 of package 101 is positioned in the center hole 12 of the circuit board 10 and the second surface 30b of the semiconductor 30 is exposed to the outside environment, so that heat generated by the semiconductor 30 is dissipated easily.

Since the construction of the semiconductor packages disclosed in the description below is similar to the construction of the semiconductor package 101 described above and illustrated in FIG. 1, the differences between the two will be described in the following discussion.

Figure 2:
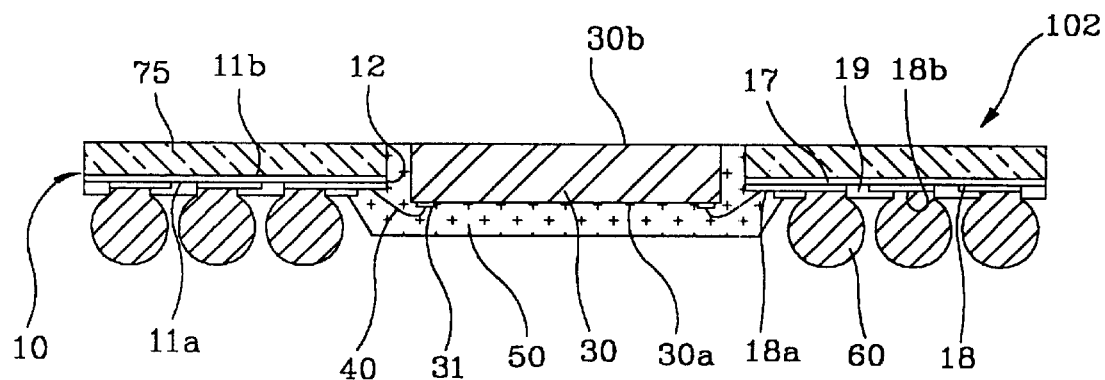

A semiconductor package 102 shown in FIG. 2 is additionally provided with a heat spreader 75 at the second surface 11b of the film 17, so that the heat dissipation capability of the semiconductor package can be improved and any bending of the circuit board 10 can be prevented.

In this embodiment, the second surface 30b of the semiconductor chip 30, the upper surface of the encapsulation material 50 around chip 30, and the upper surface of the heat spreader 75 lie in the same horizontal plane, and the second surface 30b of the semiconductor chip 30 is exposed to the outside environment.

Figure 3:
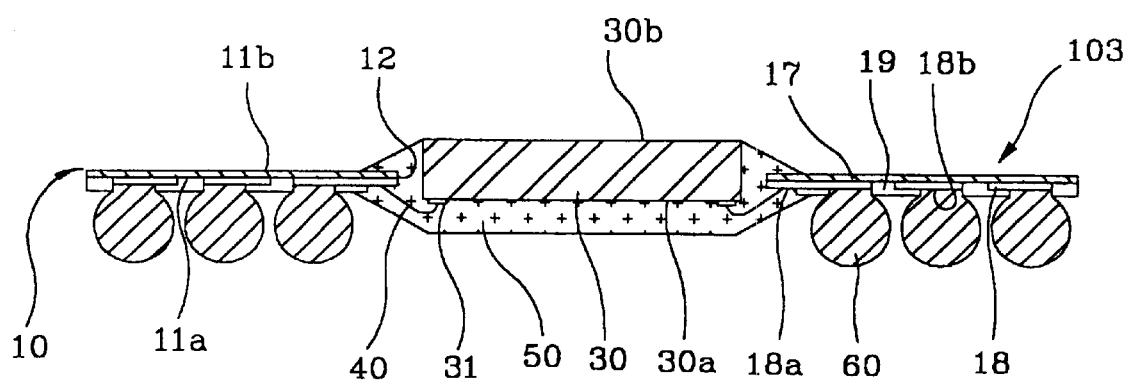

In a semiconductor package 103 of FIG. 3, the exposed second surface 30b of the semiconductor 30 is projected upwardly, so that the second surface 30b of the semiconductor 30 is positioned in a horizontal plane above the plane of second surface 11b of the film 17. In this case, the second surface 30b of the semiconductor 30 is formed to be exposed to the outside. Second surface 30b is not covered by encapsulation material 50. Encapsulant material 50 is tapered between circuit board 10 and first surface 30a and second 30b of semiconductor chip 30.

Figure 4:
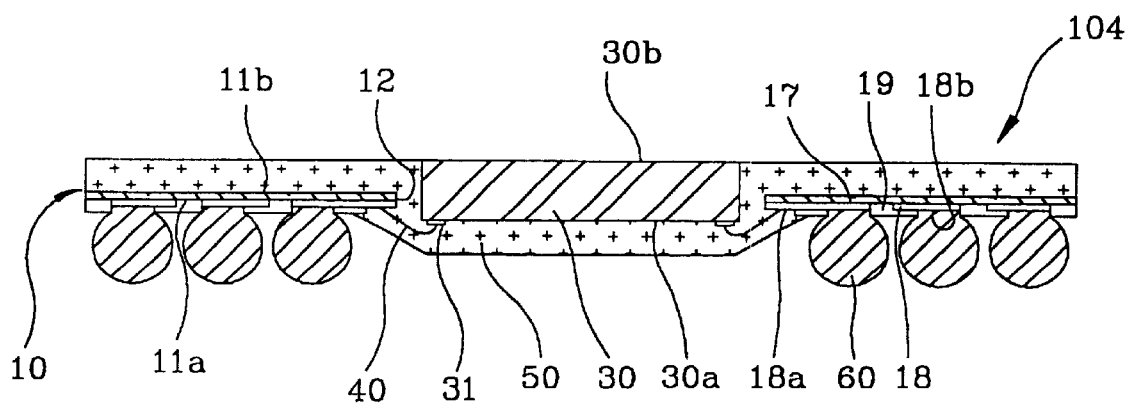

In a semiconductor package 104 of FIG. 4, the entire second surface 11b of the film 17 is covered with the encapsulation material 50, and so the encapsulation material 50 serves to reinforce the package structure so as to prevent the film 17 from being bent. Second surface 30b of semiconductor chip 30 is not covered by encapsulation material 50. Further, semiconductor chip 30 is projected upwardly so that second surface 30b is in a horizontal plane above the plane of second surface 11b of film 17. The upper planar surface of encapsulant material 50 is in the same horizontal plane as second surface 30b.

Figure 5:
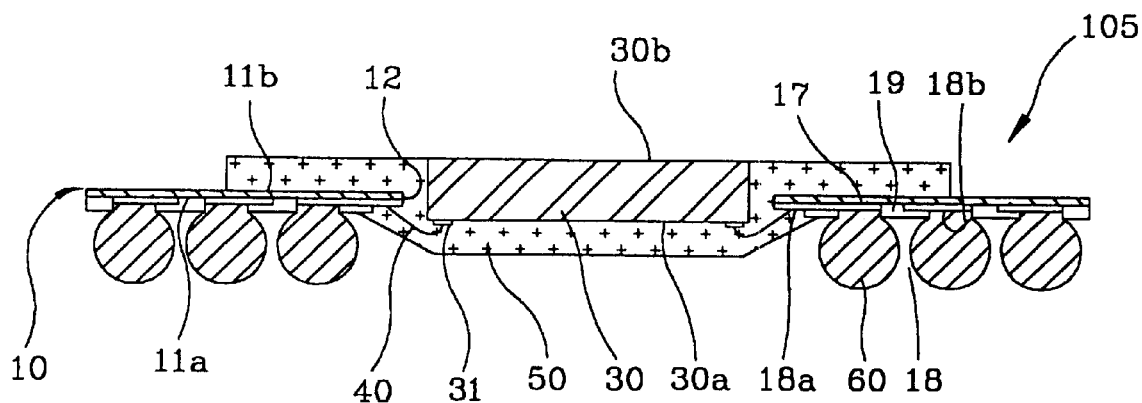

In a semiconductor package 105 of FIG. 5, part of the second surface 11b of the film 17 is covered with the encapsulation material 50. In particular, an inner portion of second surface 11b around the elevated semiconductor chip 30 in center hole 12 is covered by encapsulant material 50, and an outer peripheral portion of second surface 11b is exposed and uncovered by encapsulant material 50. The exposed second surface 30b of the semiconductor 30 and an upper planar surface of encapsulant material 50 are in a horizontal plane above the plane of second surface 11b. In this case, the encapsulation material 50 serves to restrain the bending of the film 17 to a certain extent.

In each of the semiconductor packages 101 to 105 of FIGS. 1 to 5, a plurality of input and output pads 31 are formed on the first surface 30a of the semiconductor chip 30. The first surface 30a of the semiconductor chip 30 on which the input and output pads 31 are formed and the first surface 11a of the circuit board 10 on which the bond fingers 18a and ball lands 18b are formed are oriented to the same direction. The second surface 30b of the semiconductor chip 30 faces in the same direction as second surface 11b.

Figure 6:
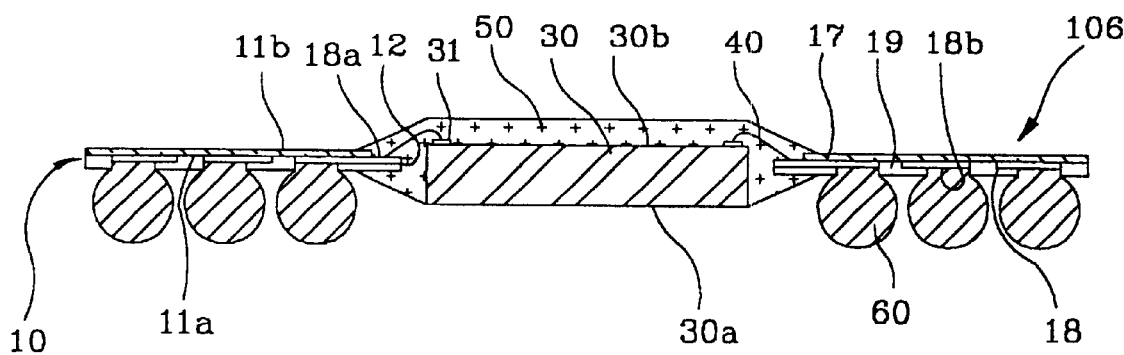
Figure 7:
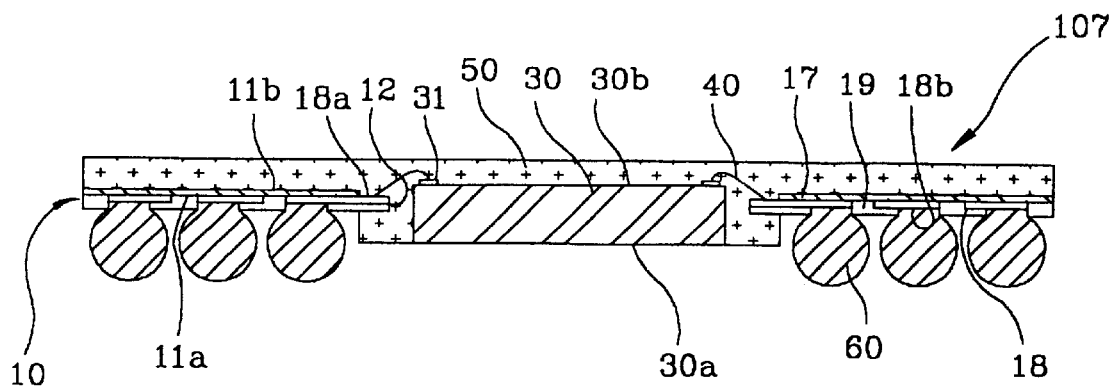
Figure 8:
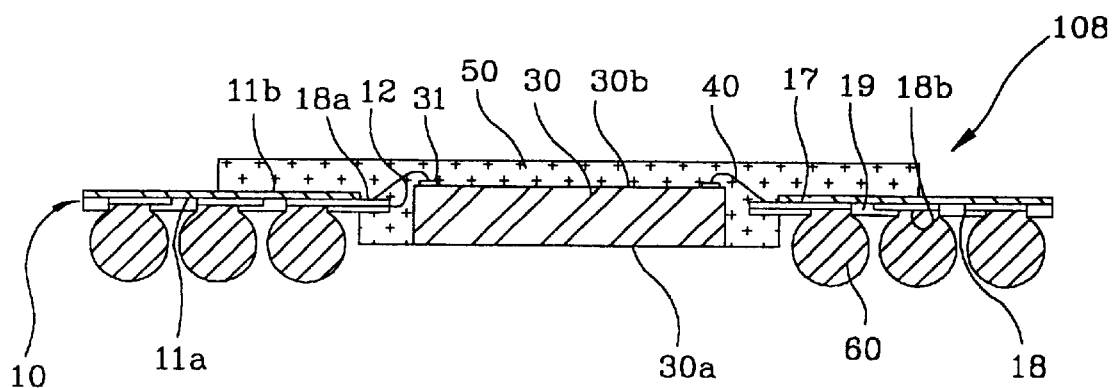

On the other hand, in each of semiconductor packages 106 to 108 of FIGS. 6 to 8, a plurality of input and output pads 31 are formed on the second surface 30b of the semiconductor chip 30. The second surface 30b of the semiconductor chip 30 on which the input and output pads 31 are formed and the first surface 11a of the circuit board 10 on which the bond fingers 18a are formed are oriented to opposite directions. The exposed first surface 30a of the semiconductor chip 30 is on the same downward side of the resin film 17 as balls 60 and bond fingers 18a.

The semiconductor package 106 shown in FIG. 6 is similar to the semiconductor package 103 shown in FIG. 3. However, the second surface 30b of the semiconductor chip 30, on which input output pads 31 are formed, and the first surface 11a of the circuit board 10, on which bond fingers 18a and ball lands 18b are formed, are oriented to opposite directions. Additionally, the bond fingers 18a are projected inwardly into the center hole 12 of the film 17 i.e., beyond the circumferential edges of center hole 12. The projected bond fingers 18a are each electrically connected with a respective input and output pad 31 on the second surface 30b of the semiconductor 30 by electric conductor 40. First surface 30a of semiconductor 30 is exposed through encapsulant material 50. First surface 30a is in a lower horizontal plane than the plane of first surface 11a of resin film 17. Encapsulant material 50 is tapered between semiconductor chip 30 and first surface 30a.

Referring to FIG. 7, the encapsulation material 50 covers the entire upper surface of the semiconductor package 107, including all of second surface 11b, second surface 30b, and electric conductors 40. The planar upper surface of encapsulant material 50 is in a horizontal plane above the apex of electric conductors 40, and the planar lower surface of encapsulant material 50 is in the same horizontal plane as exposed first surface 30a of semiconductor chip 30. First surface 30a is in a horizontal plane below first surface 11a of film 17.

In FIG. 8, encapsulation material 50 covers second surface 30b of the semiconductor chip 30 and only an inside portion of the second surface 11b of the film 17 around chip 30. The periphery of second surface 11b is uncovered by encapsulant material 50. As a result, the encapsulation material 50 prevents the circuit 10 from being bent, albeit to a lesser extent in FIG. 8 than in FIG. 7.

Figure 9:
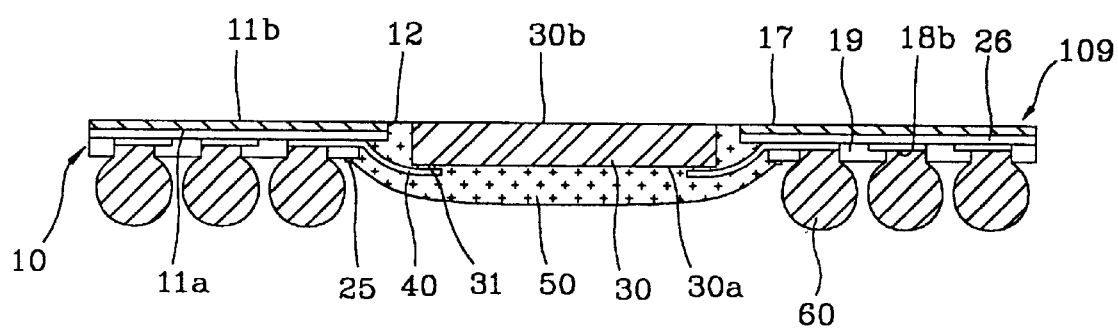

In FIG. 9, circuit patterns 18 are formed by a metal leadframe bonded to first surface 11a of film 17 by a bond layer 26 interposed therebetween. A lead 40 is electrically connected between input and output pads 31 the associated portions of the leadframe.

Figure 10A:
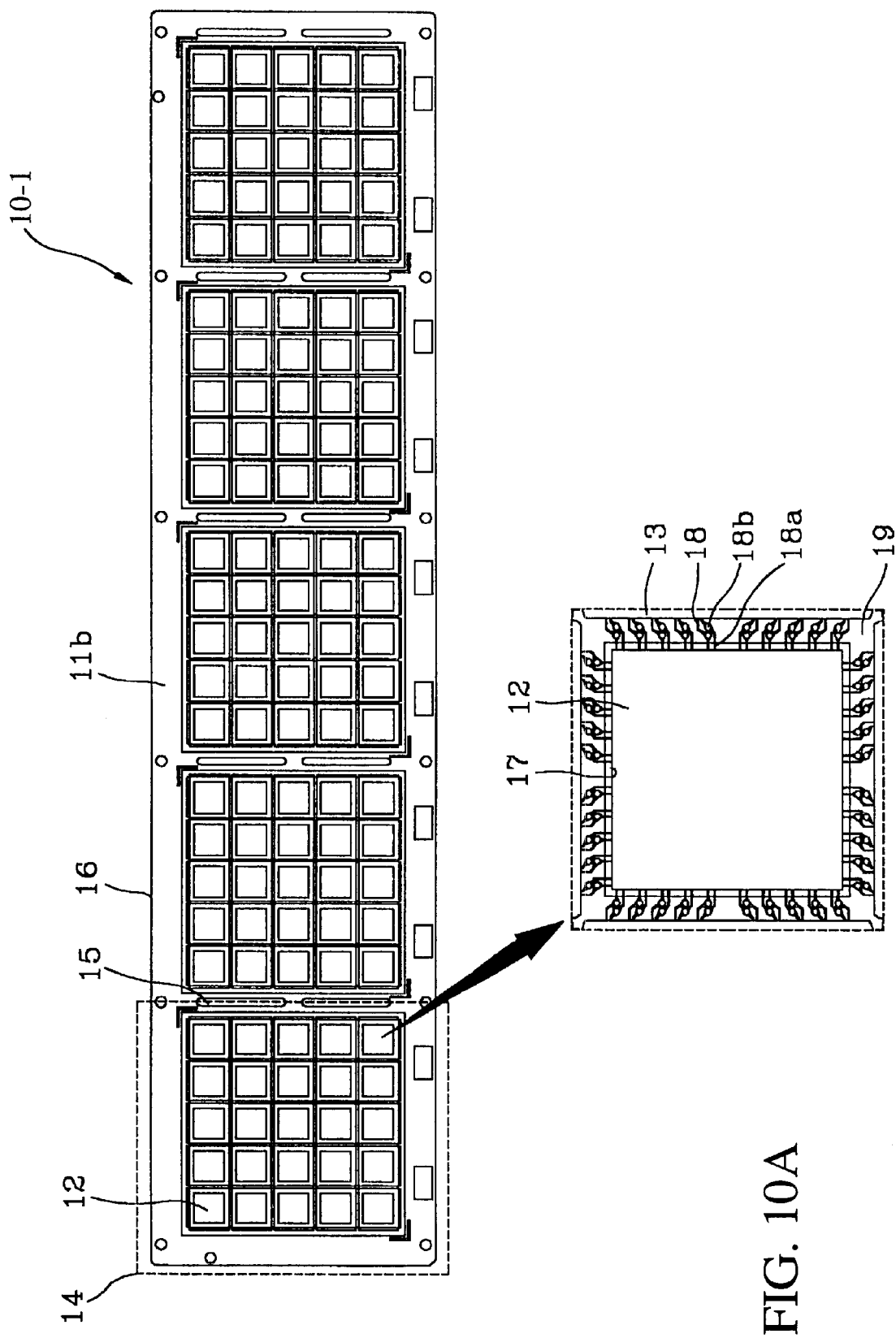
FIGS. 10A and 10B are a top plan view of a circuit board and a bottom plan view of another circuit board, the circuit boards being used in an exemplary method for manufacturing a semiconductor package according to the present invention.
Figure 10B:
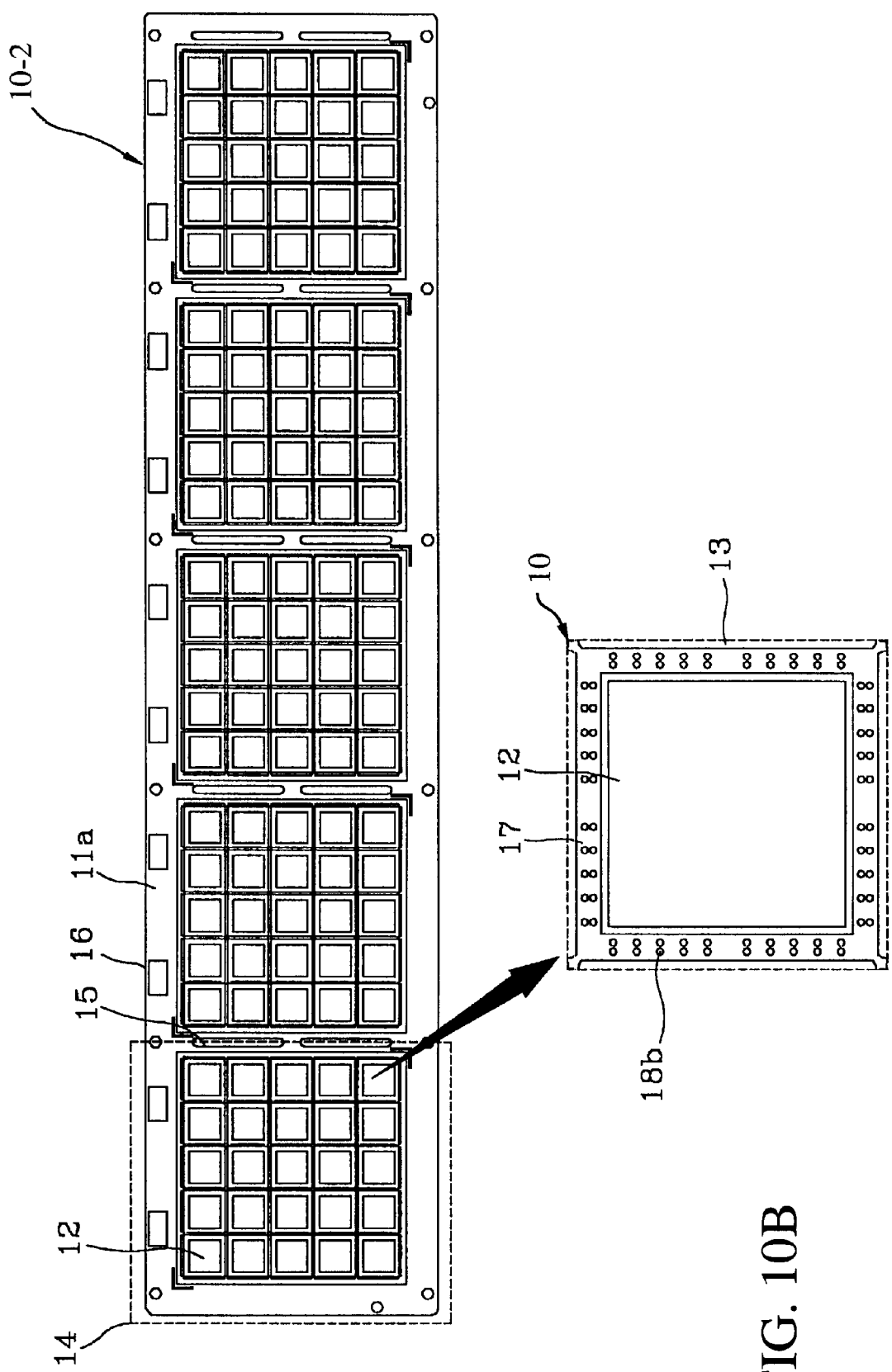

FIG. 10A is a top plan view of a circuit board sheet 10-1, and FIG. 10B is a bottom plan view of another circuit board sheet 10-2. The circuit board sheet 10-1, 10-2 may be used in a method for manufacturing a semiconductor package according to embodiment of the present invention.

The circuit board sheets 10-1, 10-2 comprise the film 17, circuit patterns 18, and the cover coat 19.

The film 17 is rectangular plate-shaped and has a first surface 11a and a second surface 11b. The film 17 is in the form of a main strip 16 that consists of a plurality of sub-strips 14 (e.g., five sub-strips 14 in this example) in a row with one or more multiple main slots 15 being interposed between two adjacent sub-strips 14. Each of the sub-strips 14 includes a rectangular, multiple-row matrix of interconnected circuit boards 10 of FIGS. 1–9, each of which includes a rectangular center hole 12 surrounded by circuit patterns 18. Peripheral sub-slots 13 are along each of the four edges of each circuit board 10 of sheets 10-1, 10-2. The main slots 15 and the sub-slots 13 pass through the film 17.

The circuit patterns 18 are formed on the portions of the film 17 between the center holes 12 and sub-slots 13, and may be in the form of thin copper films. The circuit patterns 18 include a plurality of bond fingers 18a and ball lands 18b. The bond fingers 18a will be electrically connected with the respective semiconductor chip 30, and conductive balls 60 will be fusion-welded on the ball lands 18b. The bond fingers 18a and the ball lands 18b are exposed to the outside through cover coat 19.

The cover coat 19 is coated on the circuit patterns 18 and the film 17 so as to protect the circuit pattern 18 from the external environment and is generally made of high polymer resin.

Incidentally, with the circuit patterns 18, as shown in FIG. 10A, the bond fingers 18a and the ball lands 18b may be formed on the second surface 11b of the film 17 of each circuit board 10 of circuit board sheet 10-1. However, as shown in FIG. 10B, the ball lands 18b may alternatively be formed on the first surface of the film 17 of each circuit board 10 of circuit board sheet 10-2, in which case the bond fingers 18a and the ball lands 18b are respectively electrically connected to each other through conductive via holes (not shown) through film 17. Although the ball lands 18b in two rows are illustrated, the ball lands 18b may form three, five or more rows. That is, the number of the rows is selective and is not limited in this invention.

Referring to FIGS. 11A to 11G, an embodiment of a semiconductor package manufacturing method in accordance with the present invention is described hereinafter.

Figure 11A:
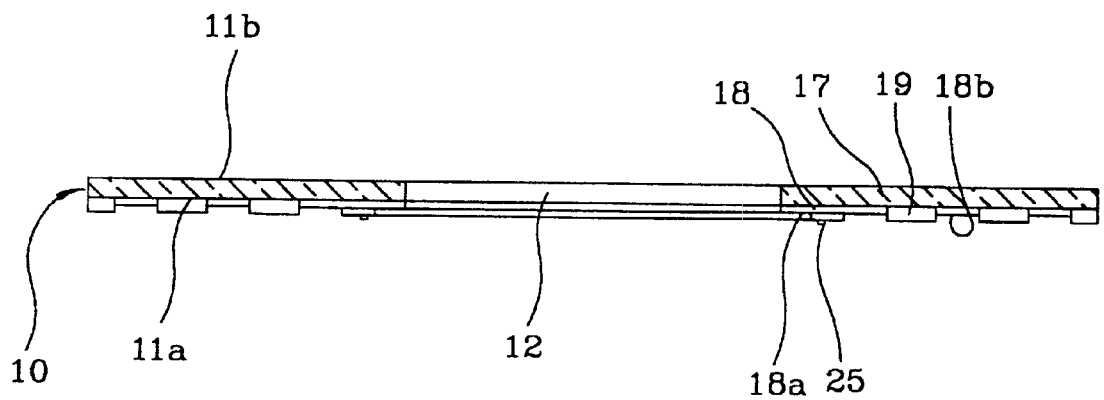
FIGS. 11A to 11B are cross-sectional side views of stages in an embodiment of a semiconductor manufacturing method within the present invention.

First of all, a circuit board sheet 10-1 as shown in FIG. 10A (or alternatively a circuit board sheet 10-2 of FIG. 10B) is provided (refer to FIG. 11A). Only one unit circuit board 10 of circuit board sheet 10-1 is illustrated in FIGS. 11A to 11g for ease of explanation. Moreover, the sub-slots 13 surrounding each individual circuit board 10 of sheet 10-1 are omitted for ease of explanation.

Figure 11B:
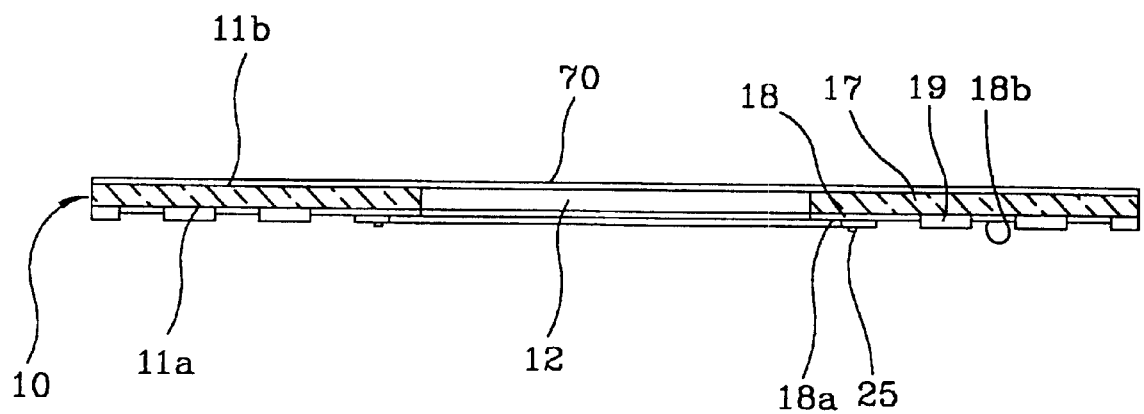
Figure 11C:
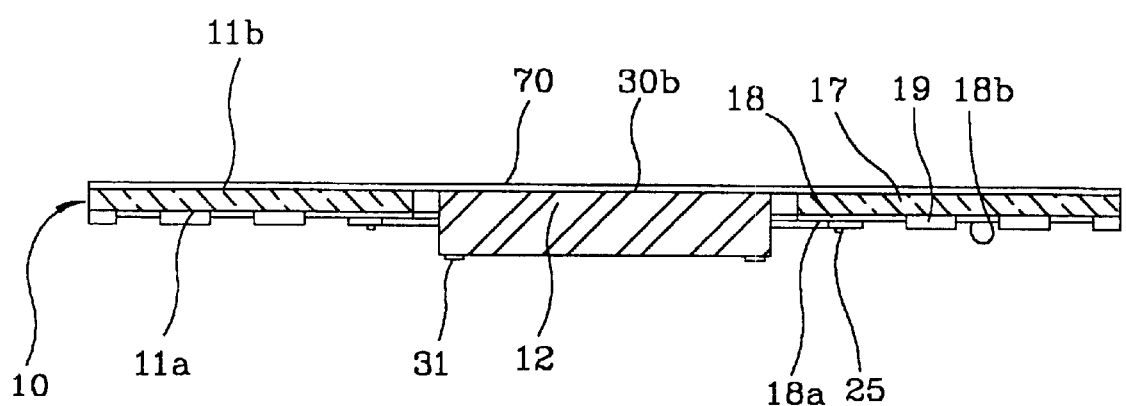

Subsequently, a hole closing member 70 is bonded on the second surface 11b of the circuit board 10 so as to cover the center hole 12 (refer to FIG. 11B). (The hole closing member 70 may be bonded on the entire circuit board (the main strip having a plurality of sub-strips) 10. This will be described in more detail with reference to FIGS. 12A and 12B.) The hole closing-member 70 may be a tape that is easily removed by application of heat or ultraviolet rays, e.g., an ultraviolet tape, but is not limited to such a tape. Other insulative or metal materials may be used for closing member 70.

Next, a semiconductor chip 30 is positioned in center hole 12 so that its first surface 30a, on which input and output pads 31 are formed, is directed downwardly in the same orientation as first surface 11a. Second surface 30b of semiconductor chip 30 is bonded to the hole closing member 70 (refer to FIG. 11C).

Figure 11D:
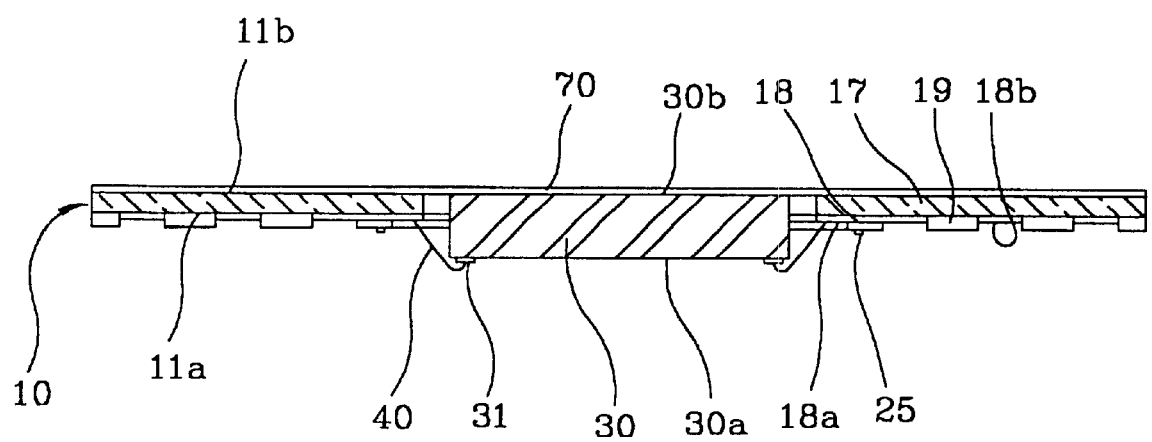

Thereafter, the input and output pads 31 of the semiconductor chip 30 are electrically connected with the bond fingers 18a of the circuit board 10 through an electric conductor 40, such as a gold wire, aluminum wire or lead (refer to FIG. 11D).

Figure 11E:
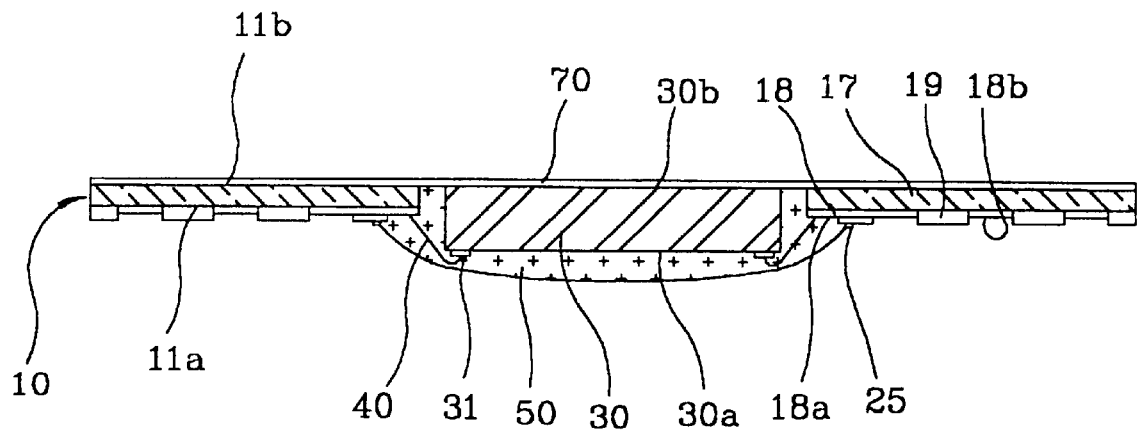

The semiconductor chip 30, the electric connector 40, and a certain portion of the circuit board 10 are covered with an encapsulation material 50, such as epoxy mold compound or liquid encapsulation material (refer to FIG. 11E). As described above, the epoxy mold compound is applied using molds, while the liquid encapsulation material is applied using a dispenser. This encapsulation step will be described in more detail with reference to FIG. 13.

Figure 11F:
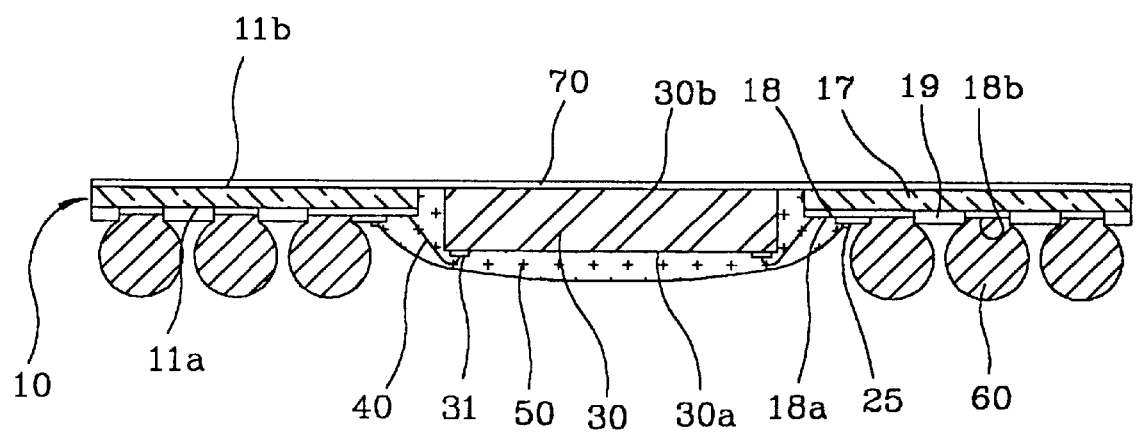

A plurality of conductive balls 60 are fusion-welded on the ball lands 18b of the circuit board 10 so as to allow the semiconductor package to be mounted to a motherboard (refer to FIG. 11F). Lands 18b and balls 60 face in the same direction as bond pads 31 of chip 30 where circuit board sheet 10-1 of FIG. 10A is used (see, e.g., FIGS. 1–5). Alternatively, where circuit board sheet 10-2 of FIG. 10b is used, lands 18b and balls 60 are on the opposite side of the package as bond pads 31 (see, e.g., FIGS. 6–9).

Before conductive balls 60 are fusion-welded on the ball lands 18b of the circuit board 10, the hole closing member 70 may be removed.

The conductive balls 60 may be fusion-welded using various techniques, such as a screen printing technique. According to the screen printing technique, viscous flux is dotted on the ball lands 18b of the circuit board 10, the conductive balls 60 are temporarily bonded on the dotted flux, and the circuit board 10 on which the conductive balls 60 are temporarily bonded is positioned in a furnace so as to fusion-weld the conductive balls 60 on the ball lands 18b.

Figure 11G:
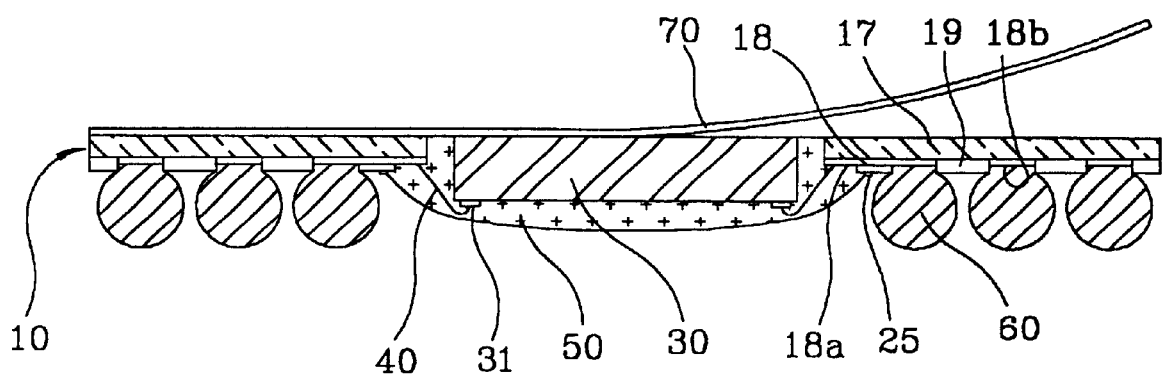

Subsequently, depending on the type of closing member 70 that is used, heat or ultraviolet rays may be applied to the upper surface of the circuit board 10 so as to facilitate removal of the hole closing member 70, thereby exposing the upper surface of the semiconductor chip 30 to the outside (refer to FIG. 11g). On the other hand, a completed semiconductor package may retain hole closing member 70, i.e., the hole closing member 70 is not removed.

Although not illustrated in the drawings, the step of dividing the circuit board 10-1 into a plurality of unit packages corresponding to the unit circuit boards 10 follows. A saw may be used to singulate individual packages.

Figure 12A:
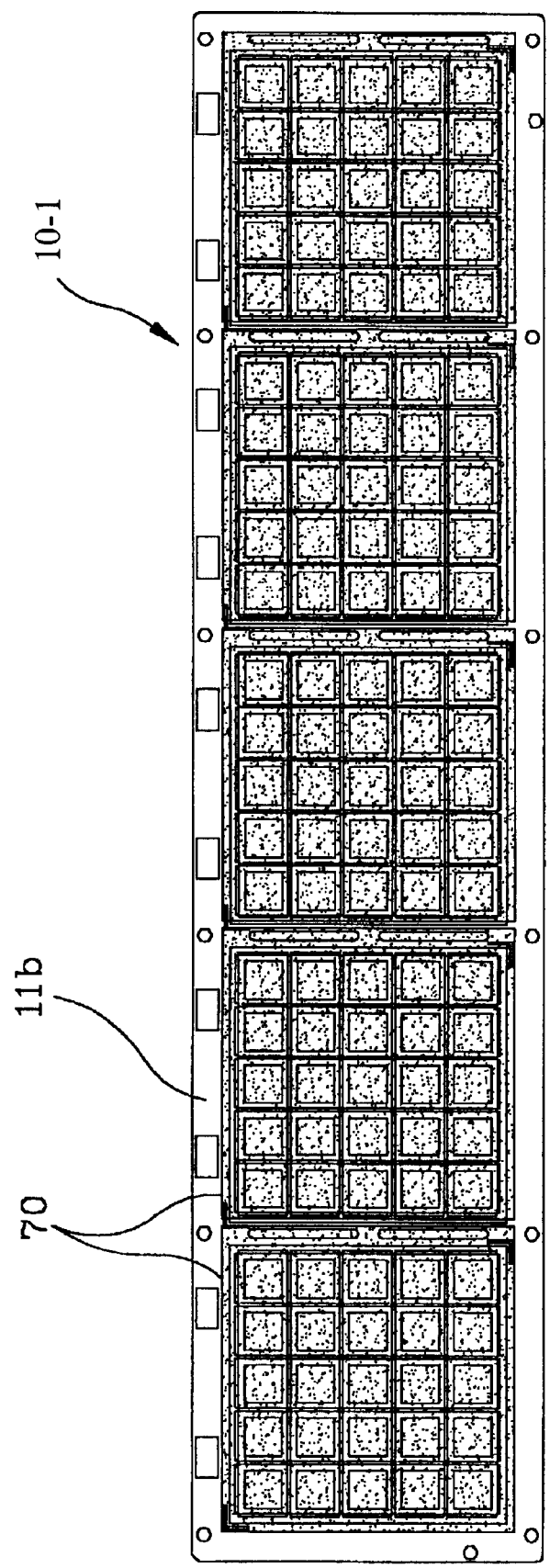
FIGS. 12A and 12B are bottom plan views of circuit boards for explaining two types of hole closing members.
Figure 12B:
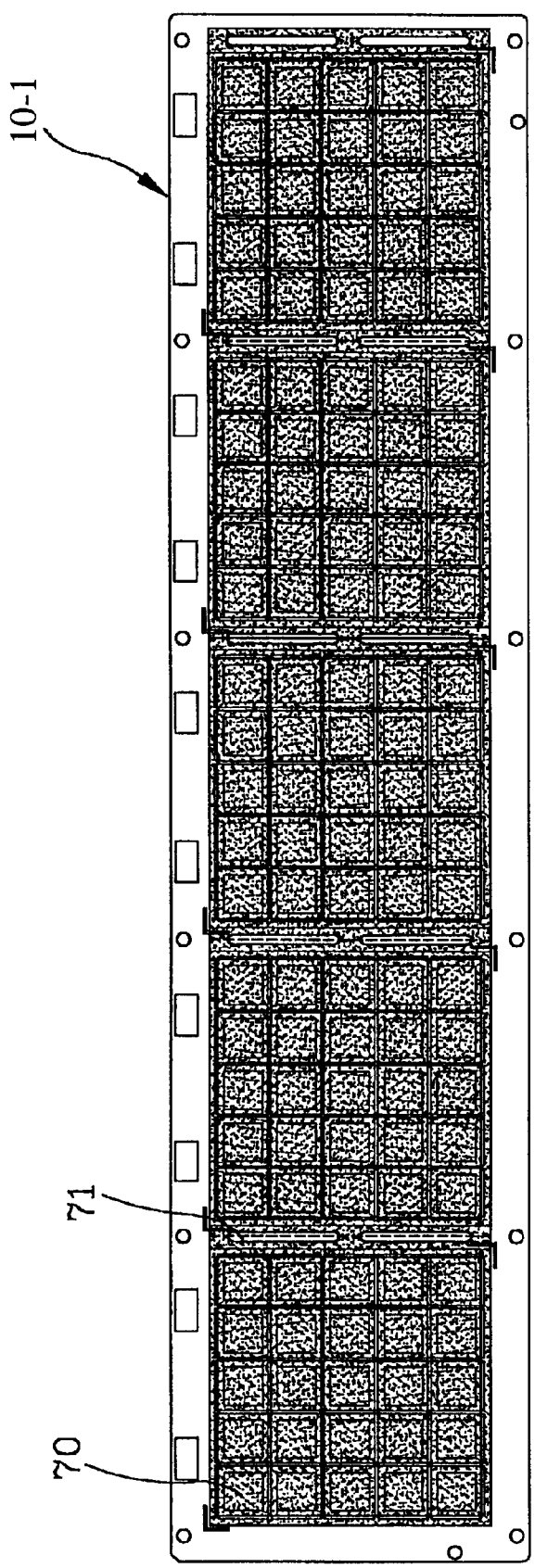

FIGS. 12A and 12B are bottom views of circuit boards for explaining two types of hole closing members.

As shown in FIG. 12A, a plurality of hole closing member pieces 70 are adhered to circuit board sheet 10-1. The hole closing member pieces 70 are respectively bonded on the sub-strips 14 so that each center hole 12 of each of the interconnected unit circuit boards 10 of the sub-strip 14 is covered by a closing member piece 70. In this case, or peripheral portion along one side of each hole closing member 70 is positioned over each of the main slots 15 between two adjacent sub-strips 14. This allows the hole closing member to be removed easily. That is, when it is required to remove the hole closing member, a plate-shaped bar (not shown) is rendered to pass through the main slot 15, so that the portion of each of the hole closing member 70 positioned over the respective main slot 15 is pushed away from circuit board sheet 10-1 by the plate-shaped bar and the hole closing member 70 can be removed easily by peeling. Of course, the plate-shaped bar is moved in a direction from the second surface 11b to the first surface 11a.

As shown in FIG. 12B, there may be used a single hole closing member sheet 70 that covers all center holes 12 of all unit circuit boards 10 of all sub-parts 14 of circuit board sheet 10-1. A plurality of hole lines 71 are formed through closing member sheet 70. The hole lines 71 are formed at positions that are situated over the main slots 15. In this case, the hole closing member is integrally bonded on the main strip 16. This also allows the hole closing member 70 to be removed easily in a manner that the plate-shaped bar is rendered to pass through the main slot 15 so that one portion of the hole closing member 70, on which the hole line 71 is formed, is pushed by the plate-shaped bar. This utilizes a technique that has been applied to a postal stamp sheet.

Figure 13:
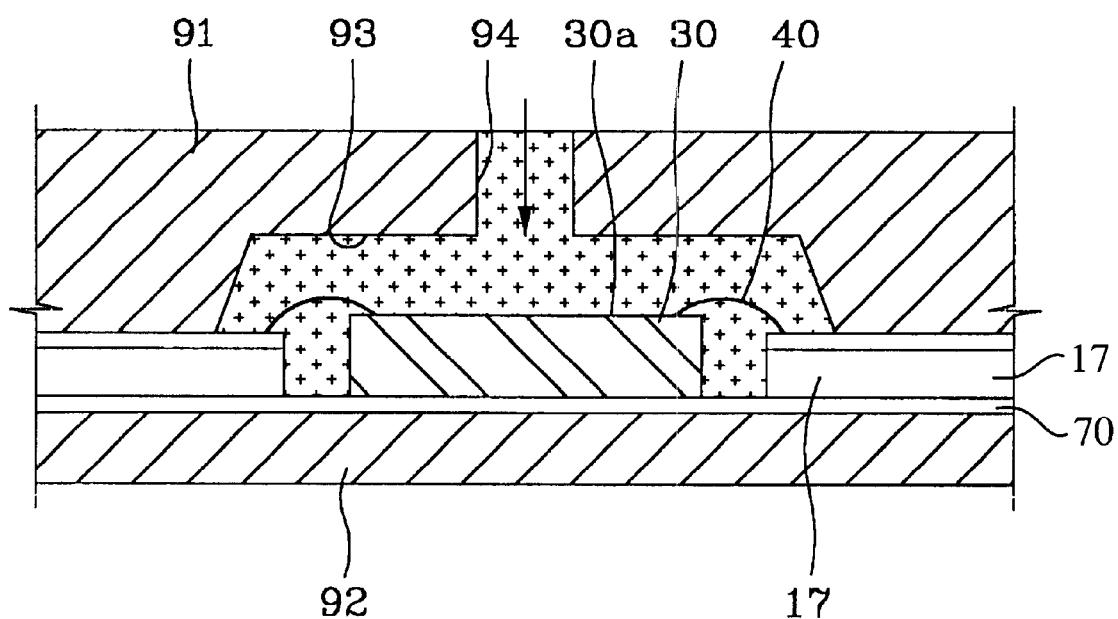
FIG. 13 is a cross-sectional side view of an embodiment of a step of encapsulating.
Figure 14:
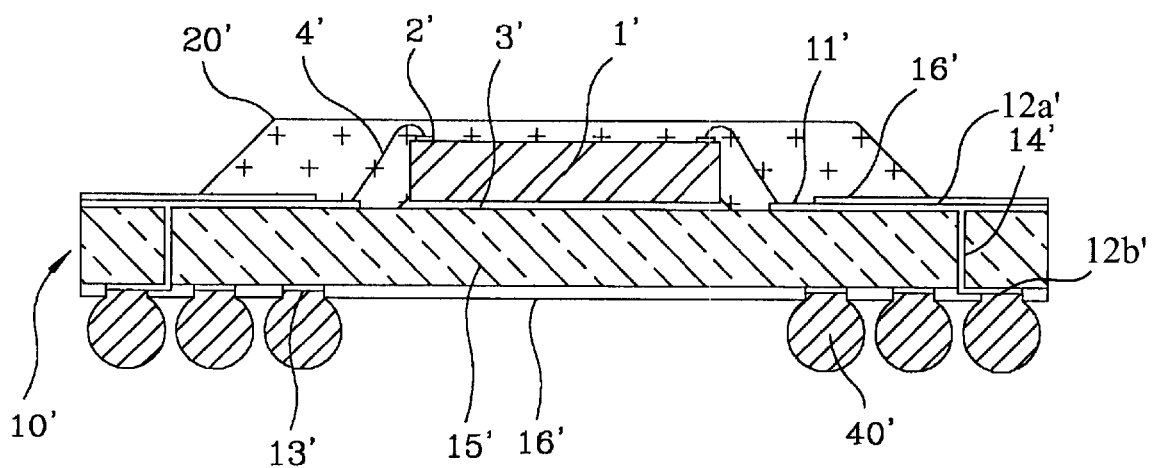
FIG. 14 is a cross-sectional side view of a prior art BGA package.

FIG. 13 illustrates an exemplary encapsulating method that may be used, for example, to make package 101 of FIG. 1.

Each circuit board 10 of circuit board sheet 10-1, 10-2 is positioned between the upper and lower dies 91 and 92 of a mold. The upper die 91 has a cavity 93 formed therein for each semiconductor chip 30 and unit circuit board 10 of circuit board sheet 10-1. As mentioned above, semiconductor chip 30 is bonded to closing member 70 within center hole 12. Each semiconductor chip 30 is placed centrally within cavity 93. Lower die 92 of the mold has a flat surface on which closure member 70 is disposed. The upper die 92 is provided with a gate 94 at the center of cavity 94 in a position such that the center portion of first surface 30a of semiconductor chip 30, on which input and output pads 31 are formed, faces and is superimposed by gate 94.

As a result, when an encapsulation material is injected into the molding die through the gate 94, the encapsulation material collides against the center portion of first surface 31a of the semiconductor chip 30, on which the input and output pads 31 are formed, and thereafter moves from the center portion to the sides of the semiconductor chip 30. Consequently, according to this step, a wire sweeping phenomena is minimized in comparison with a step in which the encapsulation material is supplied from one side of the semiconductor chip 30. This is because the encapsulation material moves from the center portion to the sides of the semiconductor chip 30 after the pressure of the injected encapsulation material is reduced in the process of colliding against the center portion of the semiconductor chip 30.

Figure 15A:
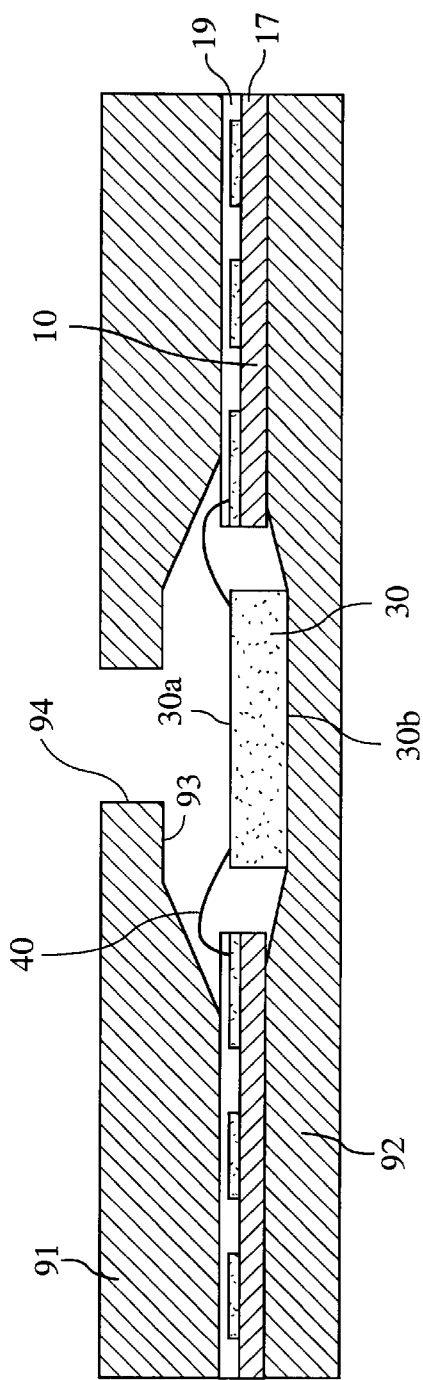
FIG. 15A is a cross-sectional side view of an alternative embodiment of a step of encapsulating.
Figure 15B:
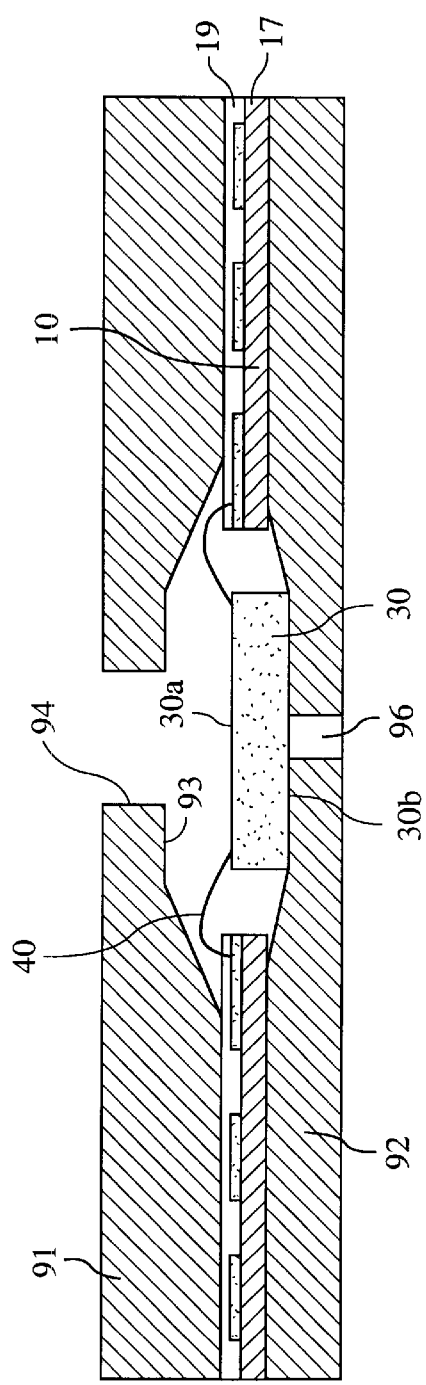
FIG. 15B is a cross-sectional side view of a further alternative embodiment of a step of encapsulating.

FIG. 15A illustrates another exemplary encapsulating method that may be used, for example, to make package 106 of FIG. 6. The encapsulation step is similar to the encapsulation step described above, in that the-mold includes an upper die 91 with a cavity 93, and a gate 94. Gate 94 is centrally located at the top of cavity 93 directly facing second surface 30b of semiconductor chip 30. Encapsulation material enters cavity 93, initially contacts a central portion of second surface 30b of semiconductor chip 30, and then moves laterally outwards, thus minimizing the wire sweeping phenomenon. In this case, lower die 92 also has a cavity 95, against which first surface 30a of semiconductor chip 30 is set. FIG. 15B illustrates a variation of the mold, where a vacuum hole 96 is centrally located in cavity 93 beneath semiconductor chip 30. Applying such a vacuum can prevent die shift and die tilt during the molding process.

Minor changes to the molds of FIGS. 15A and 15B allow the molding of the packages of FIGS. 3–5 and 7–8.

FIGS. 16A and 16B illustrate an further alternative encapsulation method, screen printing, that can be used to encapsulate the packages of FIGS. 3–8 (minor variations may be required to encapsulate the various embodiments). The stenciling machine includes an upper stencil member 97 and a lower stencil member 98 in place of dies 91 and 92 of FIGS. 15A and 15B. Encapsulant material enters through hole 99 in upper stencil member 97, and initially contacts the central portion of the facing surface of semiconductor chip 30. A vacuum hole 96 (FIG. 16B) may be provided in lower stencil member 97 to prevent die shifting and die tilt.

As described above, the semiconductor packages and methods of the present invention allow a thinner semiconductor package to be manufactured, since a hole is formed in a circuit board and a semiconductor chip is positioned in the hole.

Additionally, since one surface of the semiconductor chip is exposed to the outside or a heat spreader is bonded on one surface of the circuit board, heat generated in the semiconductor chip is easily dissipated to the environment, thereby improving the thermal and electrical capabilities of the semiconductor chip.

Furthermore, since all or part of the upper surface of the circuit board is covered with an encapsulation material, bending of the circuit board is prevented without employing a separate reinforcement member.

In addition, since an easily removable hole closing member is bonded on the circuit board prior to the encapsulation step, manufacturing the semiconductor package, the encapsulation step may be performed easily, and the hole closing member may be subsequently removed.

Finally, according to methods described above, since the encapsulation material initially contacts a center portion of a surface the semiconductor chip, and then spreads laterally outwards towards the circuit board. Accordingly, uniform encapsulation can be performed and a wire sweeping phenomenon can be prevented.

Other embodiments of semiconductor packages and methods of making them are disclosed in U.S. patent application No. 09 566,069, which was filed on May 5, 2000, and in U.S. patent application No. 09 574,541, which was filed on the same day as the present application. Both of these pending applications are incorporated herein by reference in their entireties.

Although various embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:

a semiconductor chip having a first surface, an opposite second surface, and bond pads at said first surface;

an insulative substrate having a first surface, an opposite second surface, a throughhole therebetween, and electrically conductive circuit patterns at the first surface of the substrate, each circuit pattern including a ball land, wherein the semiconductor chip is within the throughhole, the first surface of the semiconductor chip faces a same direction as the first surface of the substrate, and the second surface of the semiconductor chip is in a horizontal plane above a horizontal plane of the second surface of the substrate;

electrical conductors each extending over a portion of said throughhole and between the circuit pattern at the first surface of the substrate and one of the bond pads;

encapsulation material within said throughhole and covering the first surface of the semiconductor chip, the electrical conductors, and a portion of the first and second surfaces of the substrate around the throughhole, wherein the second surface of the semiconductor chip is exposed; and conductive balls each fused onto one of the ball lands at the first surface of the substrate.

2. The package of claim 1, further comprising an insulative cover coat that covers a portion of the circuit pattern at the first surface of the substrate.

3. The package of claim 1, wherein the encapsulant material covers the entire second surface of the substrate.

4. The package of claim 3, wherein the encapsulant material includes a planar surface in a same horizontal plane as the second surface of the semiconductor chip.

5. The package of claim 1, wherein a peripheral portion of the second surface of the substrate is not covered by said encapsulant material.

6. The package of claim 5, wherein the encapsulant material includes a planar surface in a same horizontal plane as the second surface of the semiconductor chip.

7. The package of claim 5, wherein the encapsulant material includes a tapered surface between the second surface of the substrate and the second surface of the semiconductor chip.

8. The package of claim 1, wherein the substrate is a thin resin film.

9. The package of claim 1, wherein the electrical conductors comprise bond wires.

10. The package of claim 1, wherein the circuit patterns comprise leads of a leadframe bonded to the first surface of the substrate.

11. A semiconductor package comprising:

a semiconductor chip having a first surface, an opposite second surface, and bond pads at said second surface;

an insulative substrate having a first surface, an opposite second surface, a throughhole therebetween, and electrically conductive circuit patterns at the first surface of the substrate, each circuit pattern including a ball land and a bond finger that projects into said throughhole, wherein the semiconductor chip is within the throughhole, and the second surface of the semiconductor chip faces a same direction as the second surface of the substrate;

electrical conductors each extending over a portion of said throughhole and between one of the projecting bond fingers and one of the bond pads;

encapsulation material within said throughhole and covering the second surface of the semiconductor chip, the electrical conductors, and the projecting bond fingers, wherein the first surface of the semiconductor chip is exposed; and conductive balls each fused onto one of the ball lands at the first surface of the substrate.

12. The package of claim 11, wherein the first surface of the semiconductor chip is in a horizontal plane below a horizontal plane of the first surface of the substrate.

13. The package of claim 12, wherein the encapsulant material covers the entire second surface of the substrate.

14. The package of claim 12, wherein the encapsulant material covers a portion of the second surface of the substrate around the throughhole, and a peripheral portion of the second surface of the substrate is not covered by said encapsulant material.

15. The package of claim 12, wherein the encapsulant material includes a planar surface in a same horizontal plane as the first surface of the semiconductor chip.

16. The package of claim 12, wherein the electrical conductors comprise bond wires each extending between one of the bond pads and one of the bond fingers.

17. The package of claim 11, wherein the encapsulant material covers the entire second surface of the substrate.

18. The package of claim 11, wherein the encapsulant material covers a portion of the second surface of the substrate around the throughhole, and a peripheral portion of the second surface of the substrate is not covered by said encapsulant material.

19. The package of claim 11, wherein the encapsulant material includes a planar surface in a same horizontal plane as the first surface of the semiconductor chip.

20. The package of claim 11, wherein the electrical conductors comprise bond wires each extending between one of the bond pads and one of the projecting bond fingers.

21. The package of claim 11, further comprising an insulative cover coat that covers a portion of the circuit pattern at the first surface of the substrate.

22. A semiconductor package comprising:

a semiconductor chip having a first surface, an opposite second surface, and bond pads at said first surface;

an insulative substrate having a first surface, an opposite second surface, and a throughhole therebetween;

a leadframe bonded to the first surface of the substrate, said leadframe having leads extending laterally into said throughhole, wherein the semiconductor chip is within the throughhole, the first surface of the semiconductor chip faces a same direction as the first surface of the substrate, the second surface of the semiconductor chip is in a same horizontal plane as the second surface of the substrate, and respective leads of the leadframe are electrically connected to respective ones of the bond pads;

encapsulation material within said throughhole and covering the first surface of the semiconductor chip and the leads, wherein the second surface of the semiconductor chip is exposed; and conductive balls each fused onto the leadframe.

* * * * *